United States Patent [19]

Liaw et al.

[11] Patent Number: 5,141,887
[45] Date of Patent: Aug. 25, 1992

[54] LOW VOLTAGE, DEEP JUNCTION DEVICE AND METHOD

[75] Inventors: Hang M. Liaw; Frank S. d'Aragona; Raymond M. Roop; Dennis R. Olsen, all of Scottsdale, Ariz.

[73] Assignee: Motorola, Inc., Schaumburg, Ill.

[21] Appl. No.: 687,192

[22] Filed: Apr. 17, 1991

Related U.S. Application Data

[63] Continuation-in-part of Ser. No. 546,997, Jul. 2, 1990, abandoned.

[51] Int. Cl.$^5$ .................... H01L 21/20; H01L 21/76
[52] U.S. Cl. ..................... 437/62; 148/DIG. 12; 437/86; 437/974
[58] Field of Search ............ 437/62, 86, 974; 148/DIG. 12, DIG. 135

[56] References Cited

U.S. PATENT DOCUMENTS

| | | | |
|---|---|---|---|
| 4,601,779 | 7/1986 | Abernathey et al. | 156/628 |
| 4,649,627 | 3/1987 | Abernathey et al. | 437/84 |
| 4,891,329 | 1/1990 | Reisman et al. | 437/61 |
| 4,962,051 | 10/1990 | Liaw | 437/26 |
| 5,013,681 | 5/1991 | Godbey et al. | 437/86 |

OTHER PUBLICATIONS

Kimura et al., Appl. Phys. Lett. 43(3), 1 Aug., 1983, pp. 263–265.
Haisma et al., Jap. J. Appl. Phys. 28(8), 1989 pp. 1426–1443.
Shimbo et al., "Silicon-to-Silicon Direct Bonding Method", J. Appl. Phys. 60(8) 15 Oct. 1986, pp. 2987–2989.

*Primary Examiner*—Robert Kunemund
*Assistant Examiner*—Ken Horton
*Attorney, Agent, or Firm*—Harry A. Wolin

[57] ABSTRACT

A method of fabricating a low voltage, deep junction semiconductor device includes providing first and second wafers of opposite conductivity types, each having a dopant concentration of at least $4.0 \times 10^{16}$ atoms/cc. After cleaning the wafers and removing heavy metal impurities therefrom by gettering, the wafers are bonded together. This method results in the successful fabrication of semiconductor devices having a junction depth in the range of 20 to 500 microns and a breakdown voltage of less than 20 volts.

36 Claims, 2 Drawing Sheets

LOW VOLTAGE, DEEP JUNCTION DEVICE AND METHOD

This application is a continuation-in-part of prior application Ser. No. 07/546,997, filed Jul. 2, 1990, now abandoned.

BACKGROUND OF THE INVENTION

This invention relates, in general, to semiconductor devices, and more particularly to a low voltage, deep junction semiconductor device and method.

It is desirable to have low voltage (less than 20 volts) deep junction (20–500 microns) devices such as zener diodes and high power rectifiers for many applications. The use of a deep junction can prevent degradation of device performance often caused by a transition metal such as nickel which is applied to the wafer surface during the assembly process.

Difficultly in fabricating low voltage, deep junction devices prohibits them from being readily commercially available. It is difficult and expensive to employ a conventional blanket diffusion process to make deep junction devices since prolonged diffusion time at high temperatures is required. It is particularly difficult to fabricate a deep junction having a very high dopant concentration such as is required for a low breakdown voltage device. The dopant is generally depleted at the junction because of the distance between the diffusion source and the junction. Therefore, an extremely high initial dopant concentration is required in order to achieve a dopant concentration at the deep junction of at least $4.0 \times 10^{16}$ atoms/cc which is required for a high-low junction device having a breakdown voltage of 20 volts.

Other methods of forming low voltage, deep junction devices also have several problems associated therewith. One method includes the growth of a heavily doped epitaxial layer on a heavily doped substrate of opposite conductivity type. Another includes the growth of an epitaxial layer on a heavily doped substrate followed by ion implantation of the epitaxial layer in a conductivity type opposite that of the substrate. First, epitaxial film quality is extremely poor when doped with greater than $10^{17}$ atoms/cc of an impurity which is required for various low breakdown voltage applications of high-low and symmetric junction devices. Second, a heavily doped epitaxial layer is very difficult to produce because of the hazardous nature of doping gases such as arsine, phosphine and diborane. Third, ion implantation becomes very expensive when the implant dosage is greater than $10^{17}$ atoms/cc. Accordingly, the epitaxial growth methods are typically only able to produce devices having breakdown voltages of greater than 15 volts. Furthermore, the ion implant method is generally applicable only for shallow junction (approximately 0.5 micron) devices.

In view of the above, it would be highly desirable to produce low voltage, deep junction devices that overcome the aforementioned problems.

SUMMARY OF THE INVENTION

Accordingly, it is an object of the present invention to fabricate a deep junction semiconductor device having a low breakdown voltage.

Another object of the present invention is to fabricate a deep junction semiconductor device that can achieve high carrier concentration on both sides of a PN junction.

It is an additional object of the present invention to fabricate a deep junction semiconductor device relatively inexpensively.

The foregoing and other objects and advantages are achieved in the present invention by one embodiment in which, as a part thereof, employs first and second wafers of opposite conductivity types, each having a dopant concentration of at least $1.5 \times 10^{17}$ atoms/cc. Impurities are removed from the first and second wafers by growing sacrificial thermal oxide thereon to cause gettering of the first and second wafers. The first and second wafers are then bonded together to create a device having a junction depth in the range of 20 to 500 microns and a breakdown voltage of less than 20 volts.

A more complete understanding of the present invention can be attained by considering the following detailed description in conjunction with the accompanying drawings.

DETAILED DESCRIPTION OF THE DRAWINGS

Figure 1:
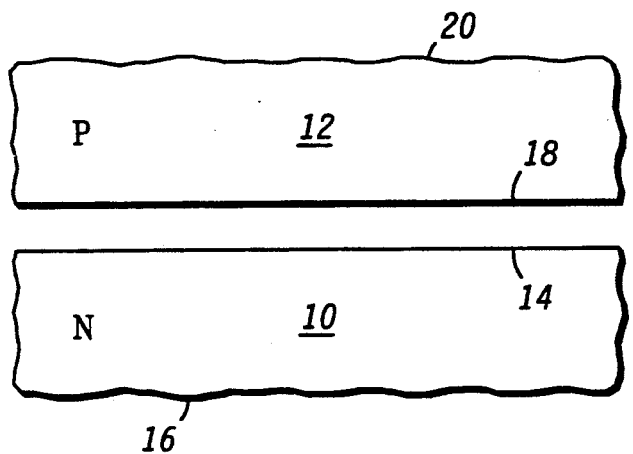
FIG. 1 is a highly enlarged cross-sectional view of portions of two wafers employed to make a low voltage, deep junction semiconductor device in accordance with the present invention.

FIG. 1 is a highly enlarged cross-sectional view of portions of a first wafer 10 and a second wafer 12 employed to make a low voltage, deep junction semiconductor device in accordance with the present invention. In the present application, low voltage refers to a semiconductor device having a breakdown voltage of less than 20 volts while deep junction refers to a semiconductor device having a junction depth in the range of 20–500 microns. First wafer 10 includes a first surface 14 and a second surface 16 while second wafer 12 includes a first surface 18 and a second surface 20. First wafer 10 and second wafer 12 both comprise single crystal silicon and have thicknesses of approximately 500 microns in this embodiment although their composition and thicknesses may vary.

First wafer 10 and second wafer 12 are of opposite conductivity types. In this embodiment, first wafer 10 is doped with antimony and has an N conductivity type while second wafer 12 is doped with boron and has a P conductivity type. Although specific conductivity types and dopants are employed herein, one of skill in the art will understand that this may be varied. Both first wafer 10 and second wafer 12 will have dopant concentrations of at least $1.5 \times 10^{17}$ atoms/cc for symmetric junction devices. For high-low junction devices such as that depicted in FIG. 3, the lightly doped wafer would have a dopant concentration of at least $4.0 \times 10^{16}$ atoms/cc while the heavily doped wafer would have a dopant concentration that is substantially higher (i.e. on the order of $10^{18}$ or $10^{19}$ atoms/cc). These are approximately the dopant concentrations required for a device having a 20 volt breakdown voltage. It should be understood that higher dopant concentrations may be employed if lower breakdown voltages are desired. For example, dopant concentrations of approximately $2.5 \times 10^{17}$ atoms/cc are required for a symmetric junction device having a breakdown voltage of approximately 15 volts.

Initially, the surfaces of first wafer 10 and second wafer 12 are cleaned. Although many cleans may be used, a two step process wherein the wafer surfaces are first cleaned with an acidic solution and secondly with a basic solution is employed herein. Once the surfaces have been cleaned, gettering of the wafers occurs to remove heavy metal impurities. In this embodiment, sacrificial thermal oxide is grown on the surfaces of first wafer 10 and second wafer 12 at a temperature of approximately 1050 degrees centigrade although temperatures in the range of 900 to 1200 degrees centigrade may be employed. The growth of this thermal oxide causes heavy metal impurities to diffuse to the oxidized wafer surfaces.

Either during or after the formation of the sacrificial thermal oxide, first wafer 10 and second wafer 12 are exposed to trichloroethane (TCA). When heated, TCA decomposes to hydrochloric acid which reacts with heavy metals and causes them to vaporize. This removes heavy metal impurities from the surfaces of first wafer 10 and second wafer 12. Following the TCA reaction, the sacrificial thermal oxide is removed from first wafer 10 and second wafer 12. Although this may be done in various manners, a wet etch employing a fluorine etchant is used to remove the sacrificial thermal oxide in this embodiment.

Once first wafer 10 and second wafer 12 have been sufficiently cleaned and gettered, first surface 14 of first wafer 10 and first surface 18 of second wafer 12 are bonded together. Thermal bonding at a temperature in the range of 850 to 1200 degrees centigrade utilizing low pressures and a dissolvable gas may be employed. U.S. Pat. No. 4,818,323 issued on Apr. 4, 1989 to F. Secco d'Aragona and H. M. Liaw discloses a method of making a void free wafer via vacuum lamination and is incorporated herein by reference. Both inventors of the invention disclosed by the incorporated patent are also inventors of the present invention. Further, both the incorporated patent and the present application are assigned to Motorola, Inc.

Figure 2:
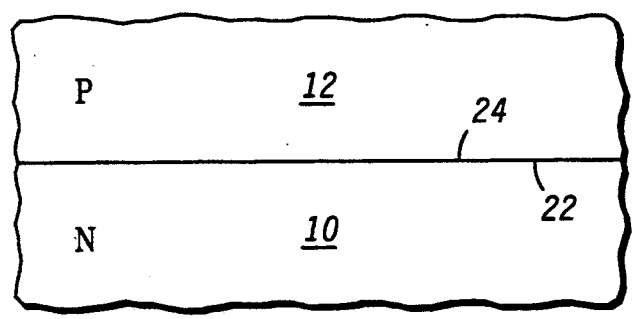
FIGS. 2–6 are highly enlarged cross-sectional views of portions of low voltage, deep junction semiconductor devices in accordance with the present invention.

FIGS. 2-6 are highly enlarged cross-sectional views of portions of low voltage, deep junction semiconductor devices in accordance with the present invention. All the depicted devices can achieve high carrier concentration on both sides of a PN junction. FIG. 2 depicts a portion of a symmetric junction semiconductor device wherein the bonding interface 22 and the electrical junction 24 are in a common position. For this to occur, first wafer 10 and second wafer 12 must have the same concentration and diffusion coefficient of the dopants. However, bonding interface 22 may often inhibit electrical performance, and therefore it is often desirable to displace electrical junction 24 from bonding interface 22.

Figure 3:
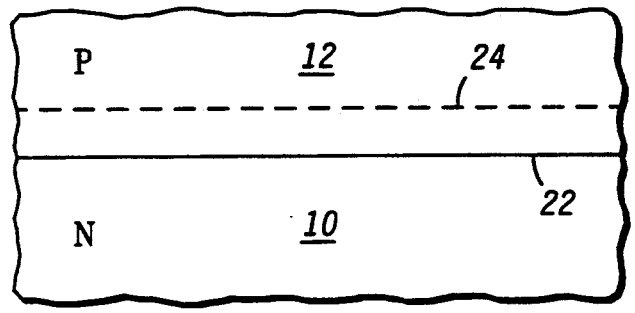

FIG. 3 depicts a portion of a high-low junction semiconductor device wherein electrical junction 24 has been displaced from bonding interface 22. The displacement of electrical junction 24 from bonding interface 22 may occur in a variety of manners. Electrical junction 24 may be displaced into second wafer 12 if first wafer 10 has a greater dopant concentration than second wafer 12. The diffusion of uncompensated dopant from first wafer 10 into second wafer 12 causes this displacement. In the present embodiment, this can greatly improve the quality of electrical junction 24 since second wafer 12 doped with boron has much better internal gettering capability than first wafer 10 doped with antimony. Although it is also possible to dope second wafer 12 with a higher dopant concentration than first wafer 10 to displace electrical junction 24 into first wafer 10, this is not as desirable because antimony doped wafers lack intrinsic gettering capability and are also poor in doping uniformity.

Figure 4:
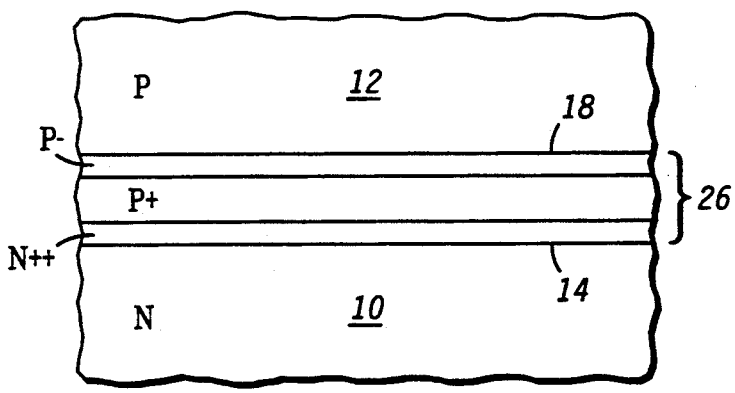

Electrical junction 24 may also be displaced from bonding interface 22 by a pre-bonding diffusion. For example, a pre-diffusion of N type dopant into P type second wafer 12 will cause electrical junction 24 to be displaced into second wafer 12. Likewise, a pre-bonding diffusion of P dopant into N type first wafer 10 will cause electrical junction 24 to be displaced into first wafer 10. The amount of displacement of electrical junction 24 may be controlled by altering the pre-bonding diffusion. FIG. 4 depicts a portion of a high-low junction semiconductor device wherein an epitaxial layer 26 has been formed on first surface 18 of second wafer 12 prior to the bonding of first wafer 10 and second wafer 12. Initially, epitaxial layer 26 is of the same conductivity type as second wafer 12 on which it is formed although it does not have as great a dopant concentration. For a uniform breakdown of devices in a given wafer, an ion implantation method should be used to initially dope epitaxial layer 26. Epitaxial layer 26 is then diffused with a P+ layer having a sheet resistance in the range of 100 to 400 ohms/square. A PN junction is then formed by diffusing or implanting N type dopant into the epitaxial layer so that it has a sheet resistance in the range of 5-10 ohms/square. The P+ layer of the junction is lighter doped than the N++ layer and determines the breakdown voltage of zener diodes and the like. The N++ layer of epitaxial layer 26 is then bonded to an N++ substrate for a deep junction structure. This allows for precisely controlled breakdown voltages and reduction of wafer inventory for a wide range of resistivities.

A device similar to that depicted in FIG. 4 may be fabricated by forming epitaxial layers on the first surfaces and 18 of first and second wafers 10 and 12 respectively. The epitaxial layers would be doped either during or after formation in the same conductivity type as the wafer on which they are formed. Further, a multiple junction device could be fabricated by doping the epitaxial layers on first and second wafers 10 and 12 in the opposite conductivity type as the wafer on which they are disposed.

Figure 5:
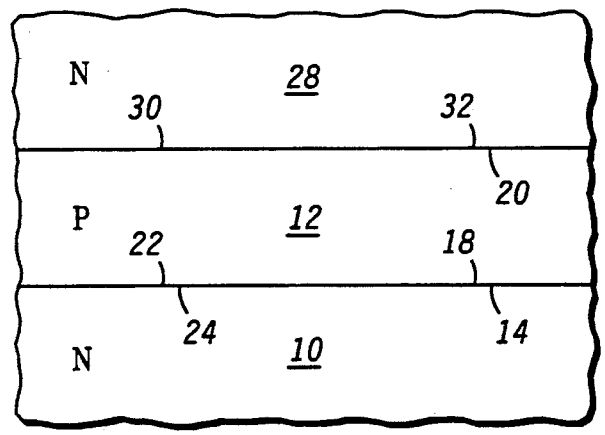

FIG. 5 depicts a portion of a multiple symmetric junction semiconductor device. Again, first surface 14 of first wafer 10 and first surface 18 of second wafer 12 are bonded together in the same manner as disclosed earlier. A third wafer 28 having an N conductivity type is bonded to second surface 20 of second wafer 12 in the same manner. The bonding of three separate wafers creates an additional electrical junction 30. It should be understood that electrical junctions 24 and 30 may be displaced from bonding interfaces 22 and 32 by the methods presented earlier to provide a high-low junction device.

Figure 6:
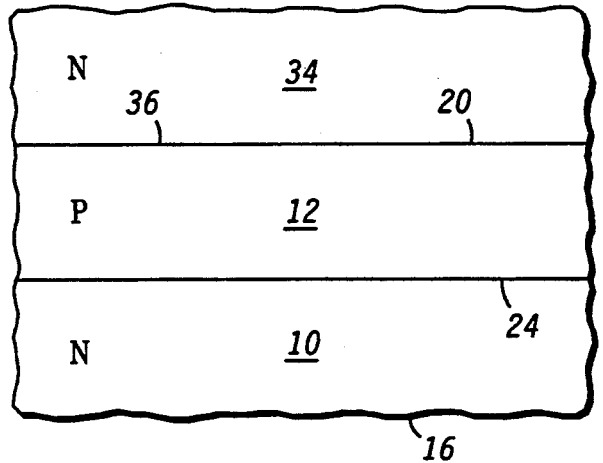

A multiple symmetric junction device as depicted in FIG. 6 may be created by forming an epitaxial layer 34 on second surface 20 of second wafer 12. It should be understood that epitaxial layer 34 must have the opposite conductivity type of the wafer on which it is formed in order for an additional electrical junction 36 to be created. In this embodiment, epitaxial layer 34 is N type and is bonded on second surface 20 of P type second wafer 12 although the present invention may include a P type wafer 10.

Thus it is apparent that there has been provided, in accordance with the invention a low voltage, deep junction semiconductor device and method which meet the objects and advantages as set forth above. While specific embodiments of the invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A method of fabricating a deep junction device having a breakdown voltage of less than 20 volts, said method comprising the steps of:

providing a first silicon wafer of a first conductivity type, said first wafer having a first surface, a second surface and a dopant Concentration of at least $4.0 \times 10^{16}$ atoms/cc;

providing a second silicon wafer of a second conductivity type, said second wafer having a first surface, a second surface and a dopant concentration of at least $4.0 \times 10^{16}$ atoms/cc;

removing impurities from said first and second wafers; and bonding said first silicon surfaces of said first and second wafers directly together.

2. The method of claim 1 wherein the first and second wafers have the same concentration and diffusion coefficient of dopants and the dopant concentration is at least $1.5 \times 10^{17}$ atoms/cc.

3. The method of claim 1 wherein the first and second wafers have different dopant concentrations.

4. The method of claim 1 wherein dopant of the opposite conductivity type of one of the first and second wafers is diffused into the first surface of one of said first and second wafers prior to the bonding step.

5. The method of claim 1 wherein an epitaxial layer is formed on the first surface of one or both of the first and second wafers prior to the bonding step.

6. The method of claim 5 wherein multiple junctions are formed.

7. The method of claim 1 wherein an additional doped wafer is bonded to the second surface of one or both of the first and second wafers to create multiple junctions.

8. The method of claim 1 wherein an epitaxial layer is formed on the second surface of one or both of the first and second wafers to create multiple junctions.

9. The method of claim 1 wherein the removing impurities step includes growing sacrificial thermal oxide on the first and second wafers, said oxide being grown at a temperature in the range of 900 to 1200 degrees centigrade and causing gettering of said first and second wafers.

10. The method of claim 9 wherein the first and second wafers are subjected to trichloroethane during or after oxide growth to vaporize heavy metal impurities from the surfaces thereof.

11. A method of fabricating a deep junction device having a breakdown voltage of less than 20 volts, said method comprising the steps of:

providing first and second silicon wafers of opposite conductivity types, each having a first surface, a second surface and a dopant concentration of at least $4.0 \times 10^{16}$ atoms/cc;

cleaning said first and second surfaces of said first and second surfaces with at least one of the group consisting of acidic and basic solutions;

gettering said first and second wafers by growing sacrificial thermal oxide thereon at a temperature in the range of 900 to 1200 degrees centigrade;

removing said sacrificial thermal oxide; and bonding said first silicon surfaces of said first and second wafers directly together.

12. The method of claim 11 wherein the first and second wafers have the same concentration and diffusion coefficient of dopants and the dopant concentration is at least $1.5 \times 10^{17}$ atoms/cc.

13. The method of claim 11 wherein the first and second wafers have different dopant concentrations.

14. The method of claim 11 wherein dopant of the opposite conductivity type of one of the first and second wafers is diffused into the first surface of one of said first and second wafers prior to the bonding step.

15. The method of claim 11 wherein an epitaxial layer is formed on the first surface of one or both of the first and second wafers prior to the bonding step.

16. The method of claim 15 wherein multiple junctions are formed.

17. The method of claim 11 wherein an additional doped wafer is bonded to the second surface of one or both of the first and second wafers to create multiple junctions.

18. The method of claim 11 wherein an epitaxial layer is formed on the second surface of one or both of the first and second wafers to create multiple junctions.

19. The method of claim 11 wherein the first and second wafers are subjected to trichloroethane during or after oxide growth to vaporize heavy metal impurities from the surfaces thereof.

20. A method of fabricating a deep junction device having a breakdown voltage of less than 20 volts, said method comprising the steps of:

providing a first silicon wafer of a first conductivity type, said first wafer having a first surface, a second a second surface and a dopant concentration of at least $4.0 \times 10^{16}$ atoms/cc;

providing a second silicon wafer of a second conductivity type, said second wafer having a first surface, a second surface and a dopant concentration of at least $4.0 \times 10^{16}$ atoms/cc;

forming an epitaxial silicon layer on the first surface of one or both of said first and second wafers;

removing impurities from said first and second wafers; and bonding said first silicon surfaces including said epitaxial layer of said first and second wafers directly together.

21. The method of claim 20 wherein the first and second wafers have the same concentration and diffusion coefficient of dopants and the dopant concentration is at least $1.5 \times 10^{17}$ atoms/cc.

22. The method of claim 20 wherein the first and second wafers have different dopant concentrations.

23. The method of claim 20 wherein dopant of the opposite conductivity type of one of the first and second wafers is diffused into the first surface of one of said first and second wafers prior to the bonding step.

24. The method of claim 20 wherein multiple junctions are formed.

25. The method of claim 20 wherein an additional doped wafer is bonded to the second surface of one or both of the first and second wafers to create multiple junctions.

26. The method of claim 20 wherein an epitaxial layer is formed on the second surface of one or both of the first and second wafers to create multiple junctions.

27. The method of claim 20 wherein the removing impurities step includes growing sacrificial thermal oxide on the first and second wafers, said oxide being grown at a temperature in the range of 900 to 1200 degrees centigrade and causing gettering of said first and second wafers.

28. The method of claim 27 wherein the first and second wafers are subjected to trichloroethane during or after oxide growth to vaporize heavy metal impurities from the surfaces thereof.

29. A method of fabricating a deep junction device having a breakdown voltage of less than 20 volts, said method comprising the steps of:
providing a first semiconductor wafer of a first conductivity type, said first wafer having a first surface, a second surface and a dopant concentration of at least $4.0 \times 10^{16}$ atoms/cc;
providing a second semiconductor wafer of a second conductivity type, said second wafer having a first surface, a second surface and a dopant concentration at least $4.0 \times 10^{16}$ atoms/cc;
removing impurities from said first and second wafers;
bonding said first semiconductor surfaces of said first and second wafers directly together; and
bonding an additional doped semiconductor wafer or forming a semiconductor epitaxial layer on the second surface of one or both of said first and second wafers to crete multiple junctions.

30. The method of claim 29 wherein the first and second wafers have the same concentration and diffusion coefficient of dopants and the dopant concentration is at least $1.5 \times 10^{17}$ atoms/cc.

31. The method of claim 29 wherein the first and second wafers have different dopant concentrations.

32. The method of claim 29 wherein dopant of the opposite conductivity type of one of the first and second wafers is diffused into the first surface of one of said first and second wafers prior to the bonding step.

33. The method of claim 29 wherein an epitaxial layer is formed on the first surface of one or both of the first and second wafers prior to the bonding step.

34. The method of claim 33 wherein multiple junctions are formed.

35. The method of claim 29 wherein the removing impurities step includes growing sacrificial thermal oxide on the first and second wafers, said oxide being grown at a temperature in the range of 900 to 1200 degrees centigrade and causing gettering of said first and second wafers.

36. The method of claim 29 wherein the first and second wafers are subjected to trichloroethane during or after oxide growth to vaporize heavy metal impurities from the surfaces thereof.

* * * * *

UNITED STATES PATENT AND TRADEMARK OFFICE
CERTIFICATE OF CORRECTION

PATENT NO. : 5,141,887
DATED : August 25, 1992
INVENTOR(S) : Liaw et al.

It is certified that error appears in the above-indentified patent and that said Letters Patent is hereby corrected as shown below:

Column 5, claim 1, line 18, delete "Concentration" and insert therefor --concentration--.

Column 6, claim 20, line 41, delete "a second".

Column 8, claim 29, line 4, delete "crete" and insert therefor --create--.

Signed and Sealed this

Seventh Day of February, 1995

Attest:

BRUCE LEHMAN

Attesting Officer    Commissioner of Patents and Trademarks